United States Patent
Chen et al.

(10) Patent No.: US 8,902,656 B2
(45) Date of Patent: Dec. 2, 2014

(54) PLURAL OPERATION OF MEMORY DEVICE

(71) Applicants: Tzung-Shen Chen, Guishan Township (TW); Shuo-Nan Hong, Zhubei (TW); Yi-Ching Liu, Hsinchu (TW); Chun-Hsiung Hung, Hsinchu (TW)

(72) Inventors: Tzung-Shen Chen, Guishan Township (TW); Shuo-Nan Hong, Zhubei (TW); Yi-Ching Liu, Hsinchu (TW); Chun-Hsiung Hung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 22 days.

(21) Appl. No.: 13/750,858

(22) Filed: Jan. 25, 2013

(65) Prior Publication Data
US 2013/0294155 A1 Nov. 7, 2013

Related U.S. Application Data

(60) Provisional application No. 61/645,378, filed on May 10, 2012, provisional application No. 61/642,349, filed on May 3, 2012.

(51) Int. Cl.
| | |
|---|---|
| *G11C 11/34* | (2006.01) |
| *G11C 16/26* | (2006.01) |
| *G11C 16/34* | (2006.01) |
| *G11C 16/12* | (2006.01) |
| *G11C 16/04* | (2006.01) |

(52) U.S. Cl.
CPC .............. *G11C 16/12* (2013.01); *G11C 16/26* (2013.01); *G11C 16/3431* (2013.01); *G11C 16/0483* (2013.01); *G11C 16/3427* (2013.01); *G11C 16/3422* (2013.01)
USPC ............ 365/185.11; 365/185.03; 365/185.17; 365/185.19; 365/185.22; 365/189.011; 365/189.15; 365/189.16; 365/189.2; 365/230.01; 365/230.03

(58) Field of Classification Search
CPC .... G11C 11/5628; G11C 16/04; G11C 16/08; G11C 16/3418; G11C 2211/5621; G11C 16/3459; G11C 2211/5641; G11C 11/413; G11C 13/004; G11C 16/3413; G06F 12/04; G06F 12/06
USPC ............ 365/185.03, 185.11, 185.17, 185.19, 365/185.22, 189.011, 189.15, 189.16, 365/189.2, 230.01, 230.03
See application file for complete search history.

(56) References Cited

U.S. PATENT DOCUMENTS

| | | | |
|---|---|---|---|
| 7,158,411 B2 | 1/2007 | Yeh et al. | |
| 2012/0176843 A1* | 7/2012 | Kalavade et al. | 365/185.19 |
| 2012/0210022 A1* | 8/2012 | Beaman | 710/6 |
| 2012/0224424 A1* | 9/2012 | Lee | 365/185.05 |
| 2012/0257453 A1* | 10/2012 | Shiino et al. | 365/185.18 |

* cited by examiner

*Primary Examiner* — Fernando Hidalgo
(74) *Attorney, Agent, or Firm* — Yiding Wu; Haynes Beffel & Wolfeld LLP

(57) ABSTRACT

An integrated circuit device comprises a semiconductor substrate, a first memory block on the substrate comprising NAND memory cells, a second memory block on the substrate comprising NAND memory cells, and controller circuitry. The first and second memory blocks are configurable to store data for a first pattern of data usage in response to a first operation algorithm to read, program and erase data, and for a second pattern of data usage in response to a second operation algorithm to read, program and erase data, respectively. The controller circuitry is coupled to the first and second memory blocks, and is configured to execute the first and second operation algorithms, wherein a word line pass voltage for read operations applied in the first operation algorithm is at a lower voltage level than a second word line pass voltage for read operations applied in the second operation algorithm.

18 Claims, 12 Drawing Sheets

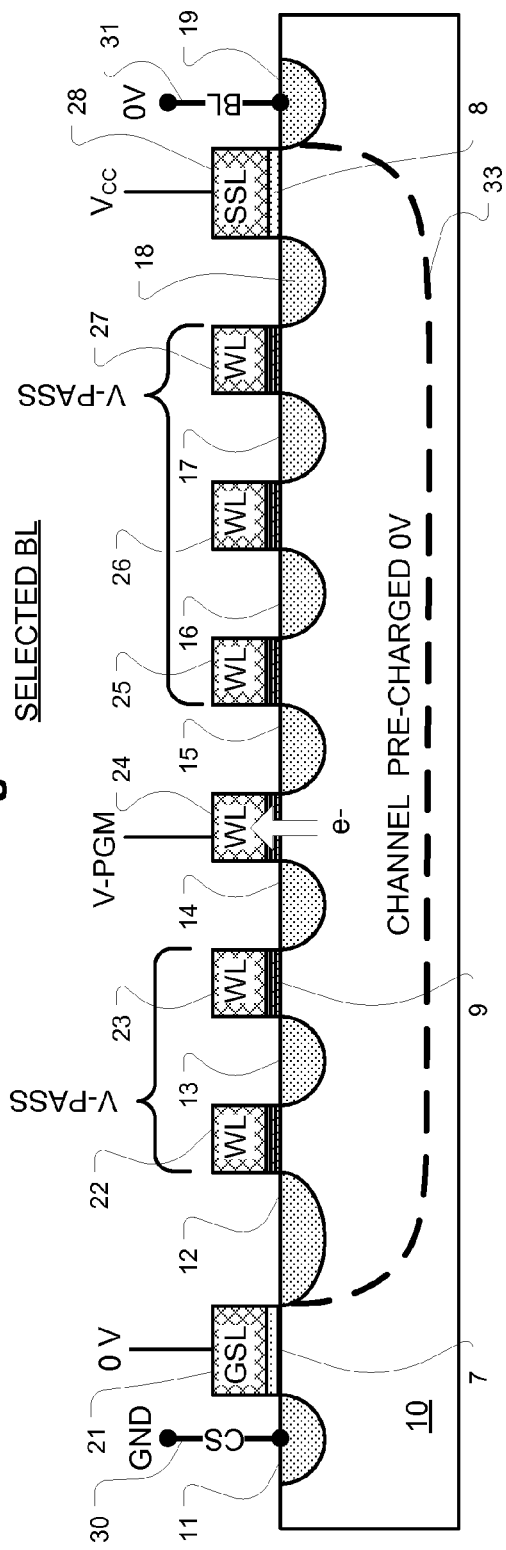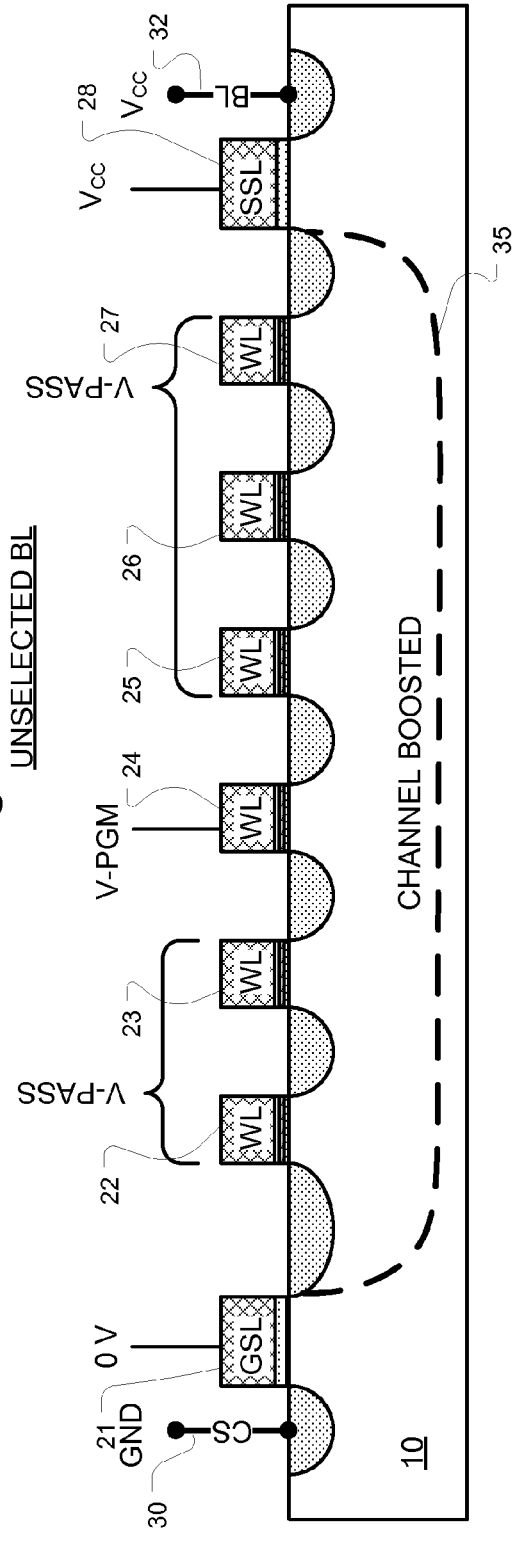

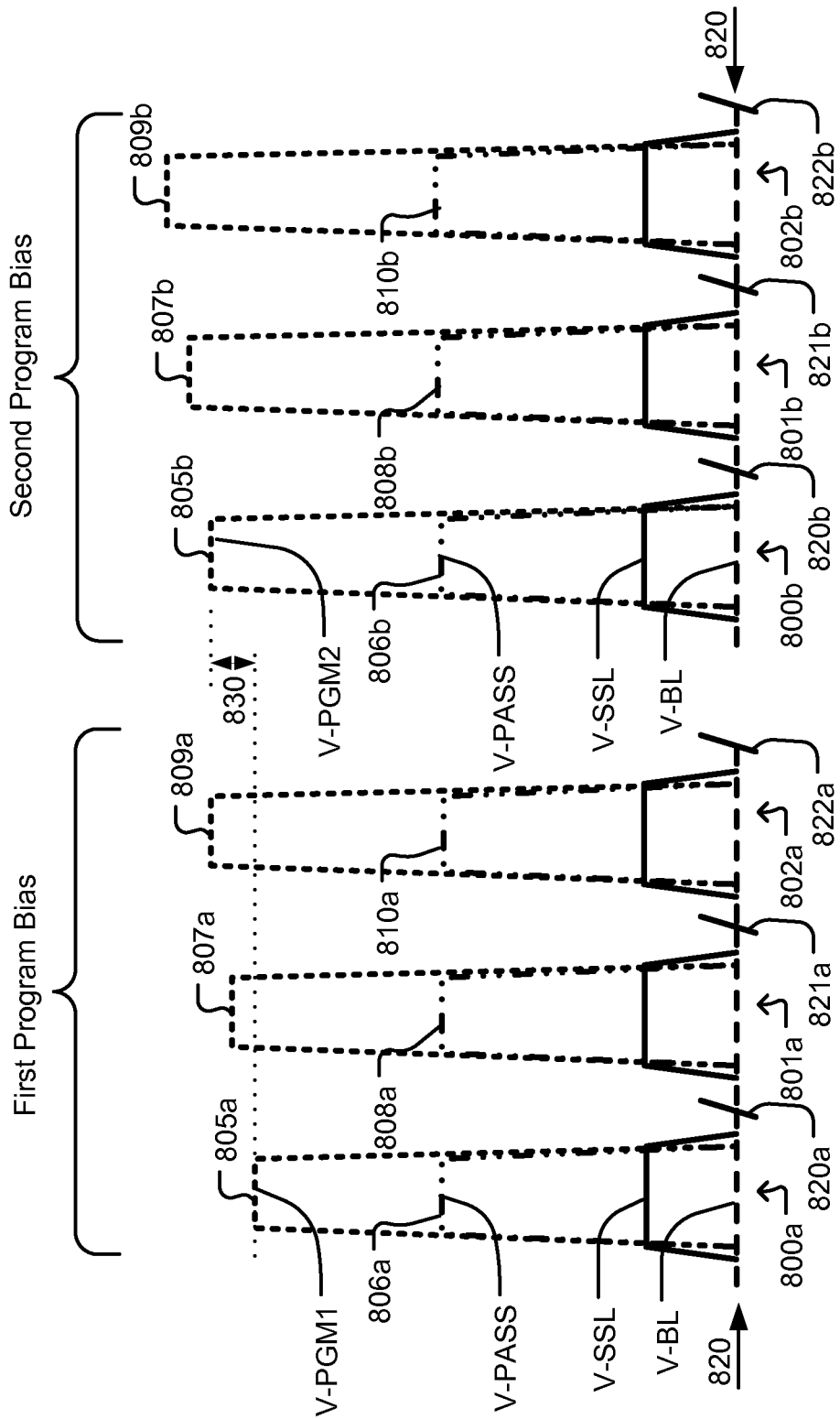

PLURAL OPERATION OF MEMORY DEVICE

RELATED APPLICATIONS

This application claims benefit of U.S. Provisional Patent Application No. 61/645,378, filed 10 May 2012, which application is incorporated by reference as if fully set forth herein, and of U.S. Provisional Patent Application No. 61/642,349, filed 3 May 2012, which application is incorporated by reference as if fully set forth herein.

BACKGROUND OF THE INVENTION

1. Field of the Invention

The present provisional application relates to flash memory technology, and more particularly to flash memory suitable for high density implementations.

2. Description of Related Art

Nonvolatile memory is computer memory that can retain the stored information when it is not powered. Nonvolatile memory includes flash memory. Flash memory applications can include code flash memory applications or data flash memory applications. Code flash memory applications typically involve frequent read operations but infrequent update operations. In comparison, data flash memory applications typically involve infrequent read operations but frequent update operations.

Data flash memory often is used for mass storage applications, in which a majority of the program, erase and read transactions involve patterns of data usage involving relatively large data sets. Code flash memory is often used for storage of data like computer instructions, in which a majority of the program, erase and read transactions involve patterns of data usage involving relatively small data sets, like updates to instructions and subroutine segments within computer programs and setting and changing values in parameter sets.

In general, data flash and code flash are differentiated by operation algorithms for programming, erasing and reading the data, and by the memory cell structures which are adapted to the operation algorithms. Integration of conventional flash memory technology for both code and data flash purposes into a single chip can be done with multiple arrays having different memory cell structures, one for code flash and one for data flash, to serve these functions. This approach requires different memory cell structures on a single chip and complex operation algorithms adapted to the different structures. Another approach is to have the same memory cell structure for both code and data purposes, and vary bias conditions on memory cells of the same structure to meet requirements for the different purposes. One issue with the latter approach is that code flash memory applications require better read disturbance immunity than data flash memory applications to avoid code corruption.

It is desirable to provide improved read disturbance immunity in a section of the memory on the chip for the code flash memory applications.

SUMMARY

An integrated circuit device comprises a semiconductor substrate, a first memory block on the substrate comprising NAND memory cells, a second memory block on the substrate comprising NAND memory cells, and controller circuitry. The first memory block is configurable to store data for a first pattern of data usage in response to a first operation algorithm to read, program and erase the data. The second memory block is configurable to store data for a second pattern of data usage in response to a second operation algorithm to read, program and erase the data.

The controller circuitry is coupled to the first and second memory blocks, and is configured to execute the first and second operation algorithms, wherein a word line pass voltage for read operations applied in the first operation algorithm is at a lower voltage level than a second word line pass voltage for read operations applied in the second operation algorithm.

A method for operating the integrated circuit device is also provided.

Other aspects and advantages of the present invention can be seen on review of the drawings, the detailed description and the claims, which follow.

BRIEF DESCRIPTION OF THE DRAWINGS

FIGS. 2A and 2B are simplified cross-sectional views of a selected NAND string and an unselected NAND string with applied program and pass voltages.

FIG. 8A is a graph showing one example of a first program operation in the first operation algorithm to program a first selected cell in a NAND string in a first memory block.

FIG. 8B is a graph showing one example of a second program operation in the second operation algorithm to program a second selected cell in a NAND string in a second memory block.

DETAILED DESCRIPTION

A detailed description of embodiments of the present invention is provided with reference to the FIGS. 1-7. Preferred embodiments are described to illustrate the present invention, not to limit its scope, which is defined by the claims. Those of ordinary skill in the art will recognize a variety of equivalent variations on the description that follows.

The present invention provides an integrated circuit including a nonvolatile memory chip, such as a NAND flash memory. The nonvolatile memory chip is divided into at least two blocks, and each block is divided into one or more sections. The sections can all be the same size, or they can be different sizes. Each block has different operation conditions to meet requirements for different applications such as the code flash memory application and data flash memory application. Locations and ranges of the sections can be either pre-defined by the memory chip manufacturer, or defined in the field by a user using user commands, storing control parameters in registers, and otherwise. The integrated circuit can include single-level cells (SLC) in one group having one or more sections, and multi-level cells (MLC) in another group having one or more other sections.

In a nonvolatile memory chip, such as a NAND flash memory, a word line pass voltage can be used to pass unselected cells, when a selected cell is programmed or read. However, the word line pass voltage may disturb the unselected cells. In memory storing information like code, the disturbance of the charge stored in the memory cells can lead to corruption for the code flash memory application. Accordingly, lower word line pass voltages can reduce read disturbance.

The technology described here can provide improved read disturbance immunity in a block of the memory on the chip for the code flash memory application with limited endurance cycles or a lower program speed, while allowing lower read disturbance immunity for the data flash memory application in the same integrated circuit chip. The blocks of memory used for the two purposes can have memory cells that have the same structure. Alternatively, some structural differences can be included in sections that are known to be used for one purpose or the other.

As described herein, an incremental step pulse programming (ISPP) operation that includes an iterative sequence of electrical pulses with verify operations can be employed to program a memory cell. The disclosure provides improving read disturbance immunity for code flash memory applications by adjusting pass voltages for unselected cells, and starting program voltages for selected cells.

Figure 1:
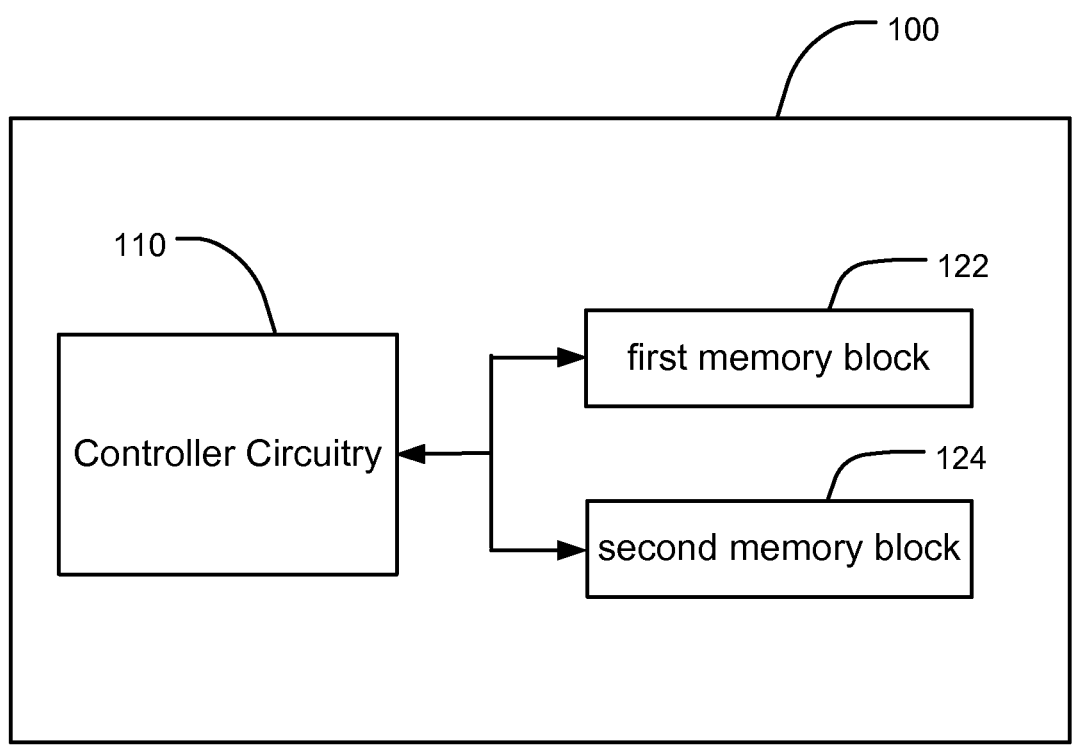
FIG. 1 illustrates an integrated circuit device 100 in accordance with an embodiment of the present technology.

FIG. 1 illustrates an integrated circuit device 100 in accordance with an embodiment of the present technology. The integrated circuit device 100 comprises a semiconductor substrate, a first memory block 122 on the substrate comprising NAND memory cells, and a second memory block 124 on the substrate comprising NAND memory cells. The first memory block 122 is configurable to store data for a first pattern of data usage in response to a first operation algorithm to read, program and erase the data. The second memory block 124 is configurable to store data for a second pattern of data usage in response to a second operation algorithm to read, program and erase the data. The first pattern of data usage can include a first rate of data cycling such as encountered with code flash memory applications, and the second pattern of data usage can include a second rate of data cycling, the second rate being higher than the first rate, such as encountered with data flash memory applications. Because of lower data cycling specifications, the operation algorithm applied to the blocks designated for the first pattern of usage can tolerate a lower memory cell endurance specification, than the operation algorithm applied to the blocks designated for the second pattern of usage. Data cycling in this context refers to the rate of changes to data in the block per unit of time. A pattern of usage including high data cycling rate involves changes in the stored data relatively often, compared to the rate of changes in the data for a lower data cycling rate. Alternatively, the first pattern of data usage can have higher data cycling specifications, and therefore require higher memory cell endurance specifications, and the second pattern of data usage can have lower data cycling specifications, and therefore require lower memory cell endurance specifications. The first and second operation algorithms differ to efficiently support different patterns of data usage within a single integrated circuit device. First memory blocks can be physically or logically contiguous or separate from each other. Likewise, second memory blocks can be physically or logically contiguous or separate from each other.

A controller circuitry 110 is coupled to the first memory block 122 and the second memory block 124, and is configured to execute the first and second operation algorithms, wherein a word line pass voltage for read operations applied in the first operation algorithm is at a lower voltage level than a second word line pass voltage for read operations applied in the second operation algorithm. Memory cells in the NAND flash memory array have substantially the same structure, regardless of whether the memory cells are in the first memory block 122 for storing data for a first pattern of data usage, or in the second memory block 124 for storing data for a second pattern of data usage.

FIG. 2A is a simplified cross-sectional view of a selected NAND string with applied program and pass voltages. The first memory block 122 and the second memory block 124 can each include multiple NAND strings. Referring to FIG. 2A, the memory cells are formed in a semiconductor substrate 10. For n-channel memory cells, the semiconductor substrate 10 can be an isolated p-well, within a deeper n-well in a semiconductor chip. Alternatively, the semiconductor substrate 10 can be isolated by an insulating layer or otherwise. In other embodiments, the NAND strings can be implemented using finFET-like structures, 3D structures, and other configurations.

The plurality of flash memory cells is arranged in a string extending in a bit line direction, orthogonal to word lines. Word lines 22-27 extend across a number of parallel NAND strings. Terminals 12-18 are formed by n-type regions (for n-channel devices) in the semiconductor substrate 10, and act as the source/drain regions for the memory cells. A first switch formed by a MOS transistor (i.e., first switch transistor), having a gate in a ground select line GSL 21, is connected between the memory cell corresponding with first word line 22 and a contact 11 formed by an n-type region in the semiconductor substrate 10. The contact 11 is connected to a common source CS line 30. The CS line 30 is an example of a "reference node" as the term is used herein. A second switch formed by a MOS transistor (i.e., second switch transistor), having a gate in a string select line SSL 28, is connected between the memory cell corresponding to the last word line 27 and a contact 19 formed by an n-type region in the semiconductor substrate 10. The contact 19 is connected to a sensing node, such as bit line BL 31. The BL 31 is an example of a "sensing node" as the term is used herein. The first and second switches in the illustrated embodiment are MOS transistors, having gate dielectrics 7 and 8 formed by, for example, silicon dioxide.

In FIG. 2A, there are six memory cells in the string for simplicity. In typical embodiments, a NAND string can comprise 32, 64 or more memory cells arranged in series. The memory cells corresponding to the word lines 22-27 have charge trapping structures 9 between the word lines and channel regions in the semiconductor substrate 10. The charge trapping structures 9 in the memory cells can be dielectric charge trapping structures, floating gate charge trapping structures, or other flash memory structures suitable for programming using techniques described herein. Also, embodiments of NAND flash structures have been developed which are junction-free, where the terminals 13-17, and optionally terminals 12 and 18, can be omitted from the structure.

FIG. 2A shows a program bias (V-PGM) according to a typical prior art technology to program the memory cell corresponding with word line 24 (selected cell), and as used in typical ISPP techniques. According to the biasing illustrated, the GSL is biased to about zero volts while the common source line is grounded, so that the first switch corresponding to the GSL 21 is off, and the SSL is biased to about $V_{CC}$ while the selected bit line is grounded, so that the second switch corresponding to the SSL 28 is on. In these conditions, the channel in the region 33 associated with the NAND string is pre-charged to about 0 Volts. The selected word line 24 receives a program pulse having a magnitude at a high voltage programming level V-PGM. The unselected word lines 22, 23 and 25-27 receive a pass pulse having a magnitude at a word line pass voltage V-PASS, which is less than V-PMG by an amount that inhibits programming in unselected memory cells in the string. As a result, electrons tunnel into the charge trapping structure of the selected memory cell during the program pulse.

FIG. 2B is a simplified cross-sectional view of an unselected NAND string with applied program and pass voltages. The unselected NAND string shares the word lines 22-27 with the selected NAND string shown in FIG. 2A. As can be seen, the GSL, the SSL and all of the word lines have the same bias voltages as shown in FIG. 2A. Likewise, the CS line 30 is grounded. However, the unselected bit line BL 32 is biased to a level about $V_{CC}$. This turns off the second switch, which corresponds with the SSL line, and decouples the channel in the region 35 from the unselected bit line BL 32. As a result, the channel in the region 35 is boosted by capacitive coupling from the voltages applied to the word lines 22-27, which prevents formation of electric fields sufficient to disturb the charge trapped in the memory cells in the unselected NAND string.

According to ISPP (Incremental Step Pulse Programming), in order to program a target memory cell to achieve a threshold voltage within a range representing a particular data value, an iterative sequence of program pulses interleaved with verify pulses are executed, in which each succeeding program pulse in the sequence is applied if the verify operation of the preceding iteration fails, has a magnitude stepped up relative to the previous pulse by a constant increment. Between each program pulse, a program verify potential (V-verify) is applied to the word line of the cell, and the data is sensed, to determine whether the cell threshold exceeds the program verify level. The program verify level is set at the low end of the range suitable for the target data value.

The program speed of a NAND flash memory array typically becomes faster after program/erase data cycling (for example because of a large threshold shift in the selected cell for each step of the ISPP iteration). With low data cycling, such as below 100 data cycling, the program speed is slower than after high data cycling, such as after 100,000 (100K) data cycling. After high data cycling, threshold voltages of programmed cells become higher after the first program pulse in the sequence of program pulses, and a distribution of threshold voltages in programmed cells become wider, as compared to before low data cycling. In read operations, the word line pass voltage V-PASS is applied to unselected word lines in a NAND string. Typically, the word line pass voltage V-PASS needs to be higher than the threshold voltages of both programmed and erased cells to make unselected cells in a NAND string act as pass transistors. Thus, to compensate for a wider distribution of threshold voltages due to high data cycling, the word line pass voltage for read operations V-PASSR needs to be higher after high data cycling than before low data cycling. However, higher V-PASSR voltages can reduce read disturbance immunity, lead to corruption for code flash memory applications, lower the program speed, and/or limit endurance cycles.

Figure 3:
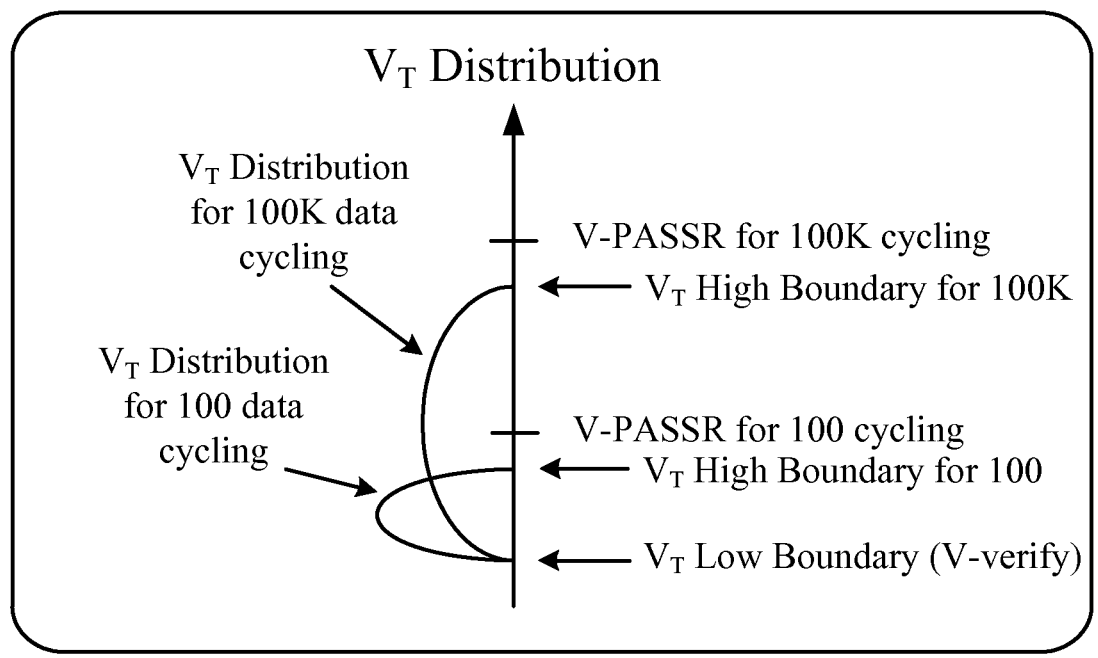
FIG. 3 is a graph of threshold voltage distributions for low data cycling and high data cycling.

FIG. 3 is a graph of threshold voltage distributions for low data cycling and high data cycling. As shown in FIG. 3, $V_T$ (threshold voltage) distribution for 100K data cycling is wider than $V_T$ distribution for 100 data cycling. $V_T$ low boundary is at about the program verify potential (V-verify) for both distributions. $V_T$ high boundary for 100K is higher than $V_T$ high boundary for 100 because $V_T$ distribution for 100K data cycling is wider. Accordingly, word line pass voltages for read operations for 100K data cycling (V-PASSR for 100K cycling) are higher than word line pass voltages for read operations for 100 data cycling (V-PASSR for 100 cycling).

The present technology provides operation algorithms for the memory array in which different word line pass voltages for read operations V-PASSR are used for code and data flash memory applications. To reduce read disturbance and thus avoid code corruption, lower V-PASSR can be applied for the code flash memory applications. When V-PASSR is lower, either the endurance of memory cells is limited while program speed remains the same, or the endurance is not limited but the program speed is lower. The endurance can be measured by number of program/erase (PE) cycles. For the data flash memory application, V-PASSR is higher with regular program speed and endurance limitation, but read disturbance immunity is lower.

The first operation algorithm to read, program and erase the data, as described in connection with FIG. 1 for the first memory block 122, can include an operation to read a first selected cell in a NAND string in the first memory block, in which first word line pass voltages for read operations (V-PASSR1) are applied to unselected cells in the NAND string having V-PASSR1 peak voltage levels. The second operation algorithm, as described in connection with FIG. 1 for the second memory block 124, can include an operation to read a second selected cell in a NAND string in the second memory block, in which second word line pass voltages for read operations (V-PASSR2) are applied to unselected cells in the NAND string having V-PASSR2 peak voltage levels. The V-PASSR1 and V-PASSR2 voltages are relative to a common voltage potential, and an average value of the first peak voltage levels is lower than an average value of the second peak voltage levels.

In reference to FIG. 2A, using the NAND string of memory cells as an example, the first selected cell or the second selected cell can be the memory cell coupled to word line 24, and the unselected cells can be the memory cells coupled to unselected word lines 22, 23 and 25-27. Similarly, word line pass voltages for read operations V-PASSR1 or V-PASSR2 can correspond to pass voltages V-PASS in the figure.

Further, a V-PASSR1 peak voltage level applied to an unselected cell, a number of cells away from the first selected cell in the NAND string in the first memory block, is lower than a V-PASSR2 peak voltage level applied to an unselected cell the same number of cells away from the second selected cell in the NAND string in the second memory block.

Figure 4:
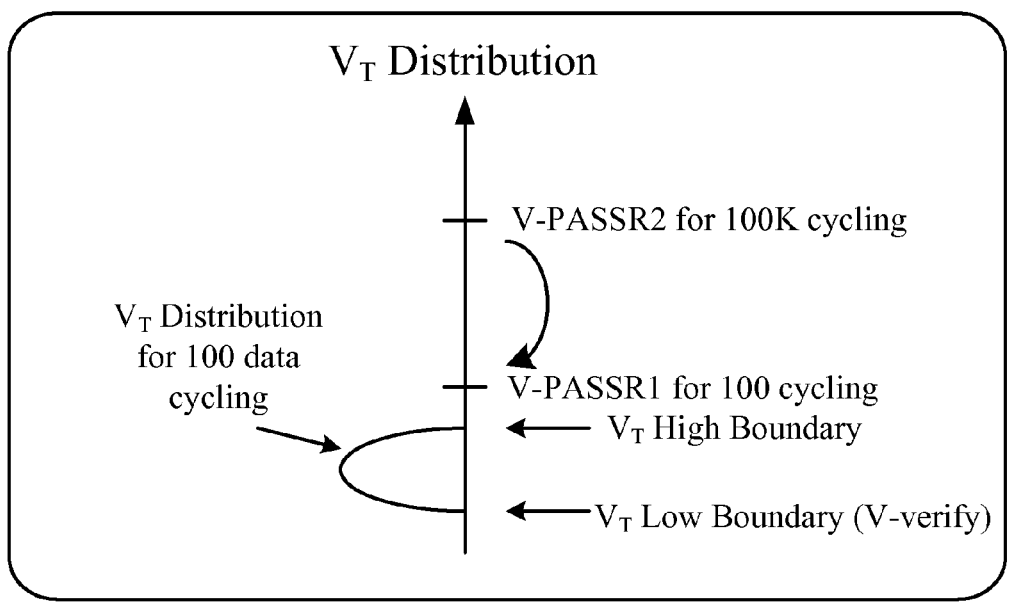
FIG. 4 is a graph illustrating lowering of word line pass voltages for read operations.

FIG. 4 is a graph illustrating lowering of word line pass voltages for read operations. Since V-PASSR1 and V-PASSR2 peak voltage levels may vary depending on factors such as locations of unselected memory cells on a NAND string relative to the selected memory cell, and PVT (process-voltage-temperature) conditions, FIG. 4 illustrates that an average value of the first peak voltage levels corresponding to V-PASSR1 can be lower than an average value of the second peak voltage levels corresponding to V-PASSR2. Since code flash memory applications require more frequent read operations and less frequent program/erase cycles than data flash memory applications, V-PASSR1 can be used with the first pattern of data usage in response to a first operation algorithm to read, program and erase data for code flash memory applications, while V-PASSR2 can be used with the second pattern of data usage in response to a second operation algorithm to read, program and erase data for data flash memory applications.

When word line pass voltages for read operations are lowered to reduce read disturbance with code flash memory applications, the endurance number (data cycling) may be limited, while the program speed may not be reduced. In one embodiment, the program bias (V-PGM) can be reduced for a first program pulse, and a lower voltage level can be chosen for the first program pulse such that after program/erase cycling, for example 100K data cycling, threshold voltages of faster memory cells are above the program verify voltage (V-verify). In this embodiment, the program speed is degraded because the lower voltage level chosen for the first program pulse can lead to additional program pulses, but endurance is not limited as much.

The first operation algorithm can include an operation to program a first selected cell in a NAND string in the first memory block, in which a first program bias (V-PGM1) is applied to the first selected cell having V-PGM1 peak voltage levels. The second operation algorithm can include an operation to program a second selected cell in a NAND string in the second memory block, in which a second program bias (V-PGM2) is applied to the second selected cell having V-PGM2 peak voltage levels. Voltage levels including the V-PGM1 and V-PGM2 peak voltage levels in the first program bias and the second program bias are relative to a common voltage potential, and an average value of V-PGM1 peak voltage levels is lower than an average value of V-PGM2 peak voltage levels.

In reference to FIG. 2A, using the NAND string of memory cells as an example, the first selected cell or the second selected cell can be the memory cell coupled to word line 24, and the unselected cells can be the memory cells coupled to unselected word lines 22, 23 and 25-27. Similarly, the first program bias V-PGM1 or the second program bias V-PGM2 can correspond to program bias V-PGM in the figure.

Further, the first program bias (V-PGM1) includes a first iterative sequence of program pulses and verify operations, and the second program bias (V-PGM2) includes a second iterative sequence of program pulses and verify operations. A first program pulse in the first iterative sequence of program pulses is at a lower voltage level than a first program pulse in the second iterative sequence of program pulses. The first sequence includes at least one subsequence of program pulses with incrementally increased voltage levels, and the second sequence includes at least one subsequence of program pulses with incrementally increased voltage levels.

Figure 5:
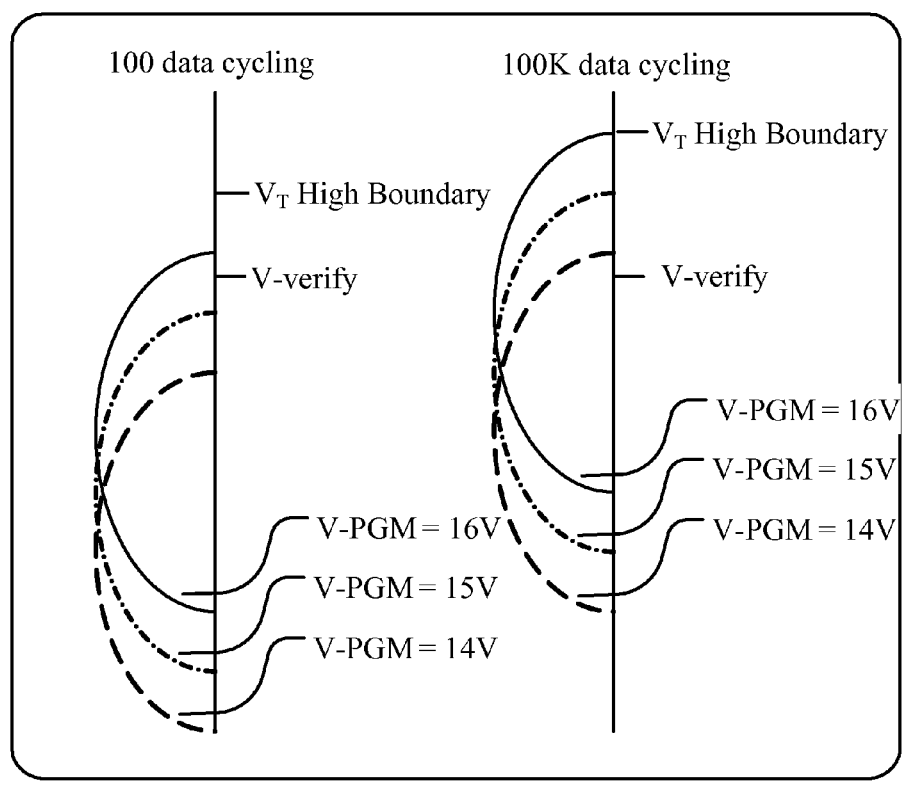
FIG. 5 illustrates an example of a program bias with a reduced voltage level for a first program pulse.

FIG. 5 illustrates an example of a program bias with a reduced voltage level for a first program pulse. In FIG. 5, for 100 data cycling, a first program pulse in the first iterative sequence of program pulses for the first program bias (V-PGM1) is reduced from 16V to 14V. For 100 data cycling, the first program pulse at 14V and a second program pulse at 15V are not effective in increasing the threshold voltage of the selected memory cell to above the program verify voltage (V-verify), and the program speed is degraded by the first two program pulses. A third program pulse at 16V is applied, and the threshold voltage is increased to be within a target distribution with a lower boundary at the program verify voltage (V-verify). For 100K data cycling, however, the first program pulse at the same reduced voltage level of 14V is effective in increasing the threshold voltage of the selected memory cell to be within the same target distribution, and thus the second program pulse at 15V and the third program pulse at 16V are not needed.

Figure 6:
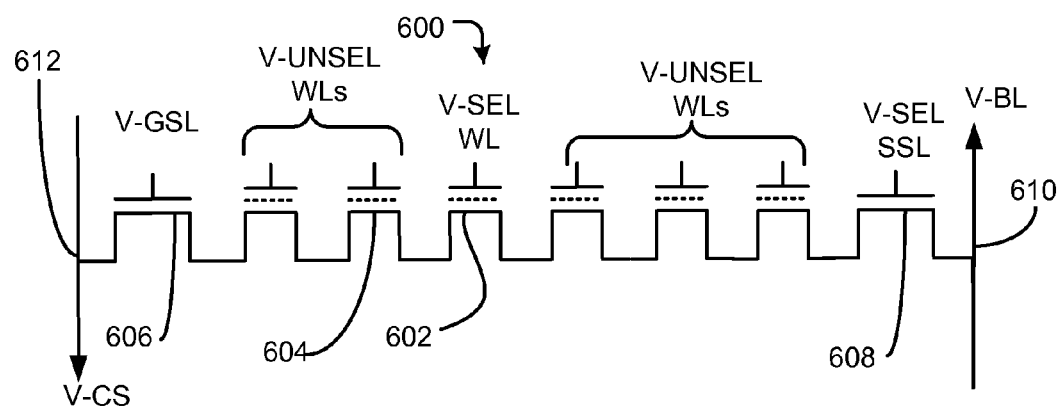
FIG. 6 illustrates a circuit diagram of a selected NAND string.

FIG. 6 illustrates a circuit diagram of a selected NAND string. The selected NAND string 600 includes a selected memory cell 602 and unselected memory cells (e.g. 604) between a ground select switch 606 and a string select switch 608. The selected NAND string is arranged between a sensing node 610 and a reference node 612. The selected memory cell 602 is coupled to a selected word line while the unselected memory cells 604 are coupled to unselected word lines. The selected NAND string is coupled through a string select switch 608 to a sensing node 610. The string select switch 608 is coupled to a selected string select line. The sensing node 610 can be a bit line. The selected NAND string is coupled through a ground select switch 606 to the reference node 612. The ground select switch 606 is coupled to a ground select line. The reference node 612 is a common source line.

Figures 7A, 7B:
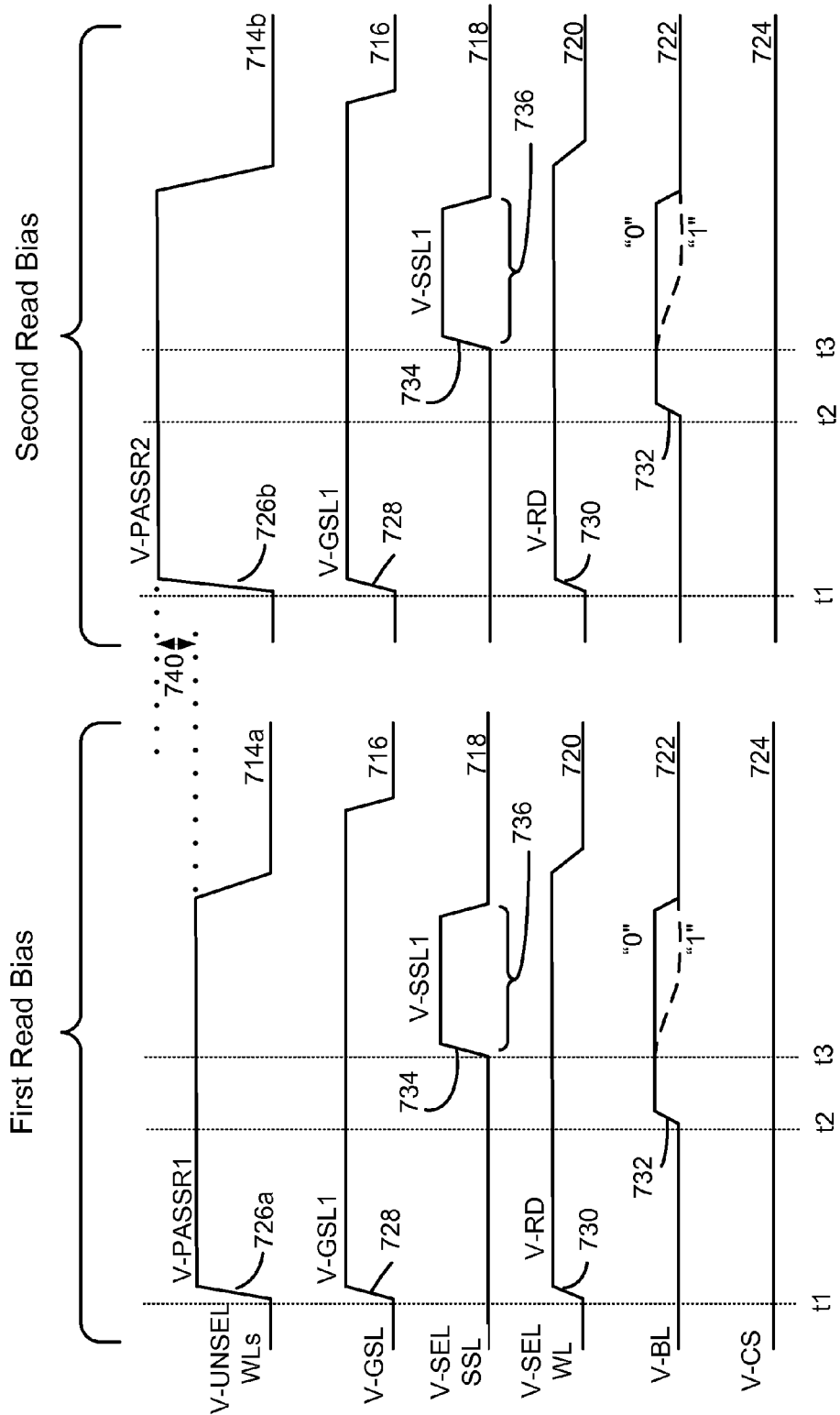
FIG. 7A is a timing diagram for one example of a first read operation in the first operation algorithm to read a first selected cell in a NAND string in a first memory block.
FIG. 7B is a timing diagram for one example of a second read operation in the second operation algorithm to read a second selected cell in a NAND string in a second memory block.

FIG. 7A is a timing diagram for one example of a first read operation in the first operation algorithm to read a first selected cell in a NAND string in a first memory block, such as the NAND string described in FIG. 6. Other read biasing arrangements can be used as well. The timing diagram includes a first interval between t1 and t2, a second interval between t2 and t3 and a third interval after t3. The trace of the voltage level of the voltage on the unselected word lines (V-UNSEL WLs) is represented by line 714a. The trace of the voltage level on the ground select line (V-GSL) is represented by line 716. The trace of the voltage level on the selected string select line (V-SEL SSL) is represented by line 718. The trace of the voltage level on the selected word line (V-SEL WL) is represented by line 720. The trace of the voltage level on the bit line (V-BL) is represented by line 722. The trace of the voltage level on the common source line (V-CS) is represented by line 724.

During the first interval, V-UNSEL WLs is transitioned at 726a to a first word line pass voltage for read operations (V-PASSR1). V-GSL is transitioned at 728 to a V-GSL1 voltage. V-SEL WL is transitioned at 730 to a V-RD voltage. V-PASSR1 is of a voltage level that is greater than the threshold voltage of any cells in the NAND string that are in a high threshold voltage state. V-GSL1, for example, can be 6V. V-RD is of a voltage level that is between the threshold voltage of a cell that is in a high threshold voltage state and the threshold voltage of a cell that is in a low threshold voltage state. V-RD, for example, can be 3V.

Throughout the duration of the first interval, V-SEL SSL and V-BL remain at a constant low voltage (e.g. ground). Additionally, throughout the duration of the first interval, V-CS remains at a constant reference voltage (e.g. ground). The voltage level transitions that occur at 726a, 728 and 730 can either occur simultaneously or at different times during the first interval. The voltage level transition at 728 causes the ground select switch 606 to close, so that the selected NAND string 600 is directly coupled to the reference node 612.

During the second interval, V-UNSEL WLs, V-GSL and V-SEL WL remain the same at the same voltage level. Additionally, during the second interval, the voltage on the sensing node V-BL is transitioned at 732 to a setup voltage. The setup voltage is of a voltage level to allow the selected cell to be read. V-BL remains at the setup voltage level throughout the duration of the second interval and into the third interval. Additionally, during the second interval, V-SEL SSL remains at a constant low voltage level, e.g. ground. As such, the string select switch 608 of the selected NAND string remains open while V-BL is transitioned at 732.

During the third interval, V-SEL SSL is transitioned at 734 to V-SSL1 voltage. V-SSL1 is of a voltage level to cause the string select switch 608 to close so that the NAND string is directly coupled to the sensing node 610. V-SEL SSL remains at V-SSL1 voltage level for a duration 736 of the third interval so that the selected memory cell 602 is read. The direct coupling of the NAND string to the sensing node 710 causes V-BL to remain at the setup voltage or decrease according to the logic level of the data that is stored in the selected memory cell. Specifically, if the selected memory cell is in the low threshold voltage state, current flows and V-BL decreases to a low voltage level. Alternatively, if the selected memory cell is in the high threshold voltage state, V-BL remains at the setup voltage. During the third interval, the voltage level on V-BL is sensed to determine the logic level of the selected memory cell by external circuitry (not shown). After the selected memory cell is read in the third interval, the voltages on V-UNSEL WLs, V-GSL and V-SEL WL are transitioned back to a low voltage level (e.g. ground).

FIG. 7B is a timing diagram for a second read operation in the second operation algorithm which can be used in coordination with the example of the first read operation described with reference to FIG. 7A, to read a second selected cell in a NAND string in a second memory block, such as the NAND string described in FIG. 6. In this example, the timing diagram in FIG. 7A and the timing diagram in FIG. 7B share the same signals including V-UNSEL WLs, V-GSL, V-SEL SSL, V-SEL WL, V-BL and V-CS, and operate in the same time intervals. These similarities in read biasing arrangements can be suitable when both the first and second block have the same type of array structure and the same type of memory cell.

The difference between the two timing diagrams is that during the first interval, V-UNSEL WLs is transitioned at 726a to a first word line pass voltage for read operations (V-PASSR1) for the first operation algorithm, while V-UNSEL WLs is transitioned at 726b to a second word line pass voltage for read operations (V-PASSR2) for the second operation algorithm. V-PASSR1 and V-PASSR1 are relative to a common voltage potential, such as ground, at which the voltage level on the common source line (V-CS) remains as shown throughout the time intervals in the two timing diagrams.

V-PASSR1 is at a lower peak voltage level than V-PASSR2, as indicated by a voltage drop 740 from V-PASSR2 in FIG. 7B to V-PASSR1 in FIG. 7A. For instance, V-PASSR1 can be at a voltage level around 4.5V, and V-PASSR2 can be at a voltage level around 6V. A NAND string can include multiple unselected memory cells. Word line pass voltages for read operations applied on unselected memory cells in a same NAND string may vary depending on how far an unselected memory cell is from the selected memory cell. In accordance with the present technology, a V-PASSR1 peak voltage level applied to an unselected cell, a number of cells away from the first selected cell in the NAND string in the first memory block, is lower than a V-PASSR2 peak voltage level applied to an unselected cell the same number of cells away from the second selected cell in the NAND string in the second memory block.

FIG. 8A is a graph showing one example of a first program operation in the first operation algorithm to program a first selected cell in a NAND string in a first memory block using a first program bias. Other program biasing arrangements can be used as well. In this example, the first program bias includes a first iterative sequence of program pulses and verify operations. The first iterative sequence of program pulses is applied using a bias arrangement like that of a typical ISPP, where the bit line is maintained at about ground potential 820, the SSL line is driven to about $V_{CC}$, the word lines for unselected cells are driven to a pass voltage level V-PASS, and the word line for the selected cell is driven to a program potential.

FIG. 8A shows three program bias pulses, including program pulse 800a, program pulse 801a and program pulse 802a. After each program pulse 800a, 801a, 802a, a program verify cycle is applied represented by the symbols 820a, 821a and 822a. If the verify operation passes, then the program sequence stops. If it fails, then the program sequence continues to a next pulse in the illustrated sequence. The verify potential used during the program verify cycle following each of the three pulses can be about equal at a pass voltage level V-PASS (levels 806a, 808a, 810a). The program potential voltages (V-PGM1) for the three pulses are incrementally increased, so that pulse 800a has a program potential at peak voltage level 805a, pulse 801a has a program potential at peak voltage level 807a, and pulse 802a has a program potential at peak voltage level 809a.

FIG. 8B is a graph showing a second program operation in the second operation algorithm to program a second selected cell in a NAND string in a second memory block using a second program bias which can be used in coordination with the example of the first program operation described with reference to FIG. 8A. The second program bias includes a second iterative sequence of program pulses and verify operations. The second iterative sequence of program pulses is applied using a bias arrangement like that of a typical ISPP, where the bit line is maintained at about a ground potential 820, the SSL line is driven to about $V_{CC}$, the word lines for unselected cells are driven to a pass voltage level V-PASS, and the word line for the selected cell is driven to a program potential.

FIG. 8B shows three program bias pulses, including program pulse 800b, program pulse 801b and program pulse 802b. After each program pulse 800b, 801b, 802b, a program verify cycle is applied represented by the symbols 820b, 821b and 822b. The verify potential used during the program verify cycle following each of the three pulses can be about equal at a pass voltage level V-PASS (levels 806b, 808b, 810b). The program potential voltages (V-PGM2) for the three pulses are incrementally increased, so that pulse 800b has a program potential at peak voltage level 805b, pulse 801b has a program potential at peak voltage level 807b, and pulse 802b has a program potential at peak voltage level 809b.

Voltage levels, including the V-PGM1 peak voltage levels 805a, 807a, and 809a in the first program bias, and the V-PGM2 peak voltage levels 805b, 807b, and 809b in the second program bias, are relative to a common voltage potential such as the ground potential 820. The first program pulse 800a in the first iterative sequence of program pulses (FIG. 8A) is at a lower peak voltage level 805a than a peak voltage level 805b in the first program pulse 800b in the second iterative sequence of program pulses (FIG. 8B), as indicated by a voltage drop 830 from the peak voltage level 805b to the peak voltage level 805a. Each succeeding program pulse in the first or the second iterative sequence can have a magnitude stepped up relative to the previous pulse by a constant increment. An average value of the V-PGM1 peak voltage levels is lower than an average value of the V-PGM2 peak voltage levels, as indicated by the voltage drop 830.

As described herein, the integrated circuit device 100 includes a first memory block and a second memory block, which can be physically or logically divided, with different pass voltages for read operations (V-PASSR). The memory block with lower V-PASSR has better read disturbance immunity and is thus more suitable for code flash memory applications. The integrated circuit device 100 also can logically or physically define a high block boundary and a low block boundary, wherein the first memory block can include memory cells at addresses within a range between the high block boundary and the low block boundary. One of the high block boundary and low block boundary can be assumed, without need for logical specification, such as by assuming the block boundary resides as a pre-defined physical address, such as 0000. The second memory block can include memory cells at addresses outside the first memory block.

Optionally, the integrated circuit device 100 can include a second high block boundary, and a second low block boundary, wherein the second memory block can include memory cells at addresses within a second range between the second high block boundary and the second low block boundary.

The one or more block boundaries can be stored in at least one of the first memory block and the second memory block of the device. The integrated circuit device 100 can include registers, such as fuse bits, and the one or more block boundaries can be stored in the registers. If the boundary information is stored in nonvolatile memory blocks and the configuration is expected to be static, then changing the boundary information can lead to a possibility of changing the operating mode of a memory block that already stores data, which may lead to unintentional data loss. So it may be preferred to block such changes. If the boundary information is stored in volatile register, at least one of the high block boundary and the low block boundary can be adjustable via commands received from a process external to the device, as controlled by the system with consideration to avoid data loss.

Figure 9:
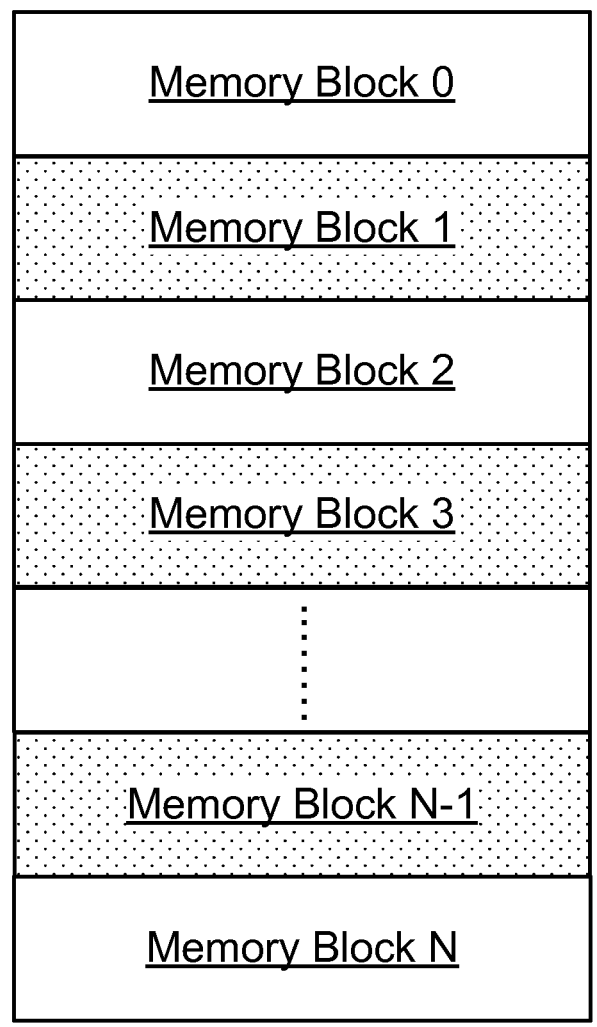
FIG. 9 illustrates memory blocks separated into two groups.

FIG. 9 illustrates memory blocks in an integrated circuit device separated into two groups. At least two memory blocks can be defined in the integrated circuit device. The memory blocks can be separated into at least two groups for different word line pass voltages for read operations (V-PASSR). The group with lower V-PASSR has better read disturbance immunity. For instance, a first group of memory blocks can include memory blocks 1, 3, N−1, while a second group of memory blocks can include memory blocks 0, 2, . . . N. Memory blocks in the first group can have a lower V-PASSR than memory blocks in the second group. Memory blocks in a same group, whether the same group is the first group or the second group, can be physically or logically contiguous or non-contiguous.

Figure 10:
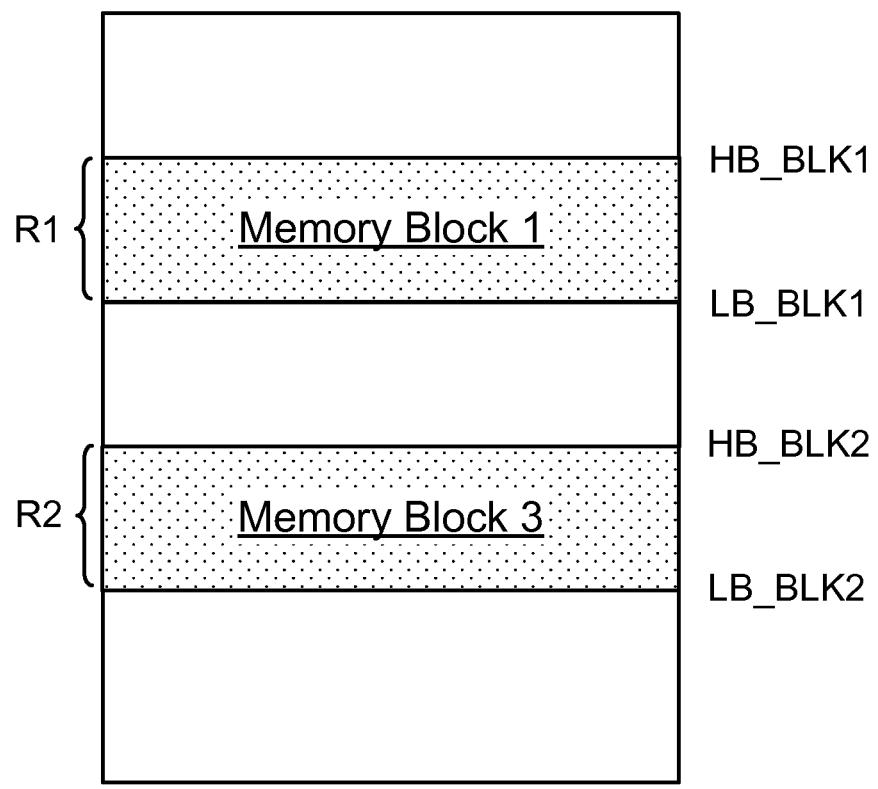
FIG. 10 illustrates block boundaries for first memory blocks.

FIG. 10 illustrates block boundaries for first memory blocks. The first memory blocks, such as memory block 1 and memory block 3 from the first group of memory blocks as described for FIG. 9, has lower V-PASSR voltages, lower starting program voltages, and better read disturbance immunity than second memory blocks, such as memory block 0 and memory block 2 from the second group of memory blocks as described for FIG. 9. Each of the first memory blocks has a high block boundary and a low block boundary. For example, memory block 1 has a range R1 between a high block boundary HB_BLK1 and a low block boundary LB_BLK1, and memory block 3 has a range R2 between a high block boundary HB_BLK2 and a low block boundary LB_BLK2.

Figure 11:
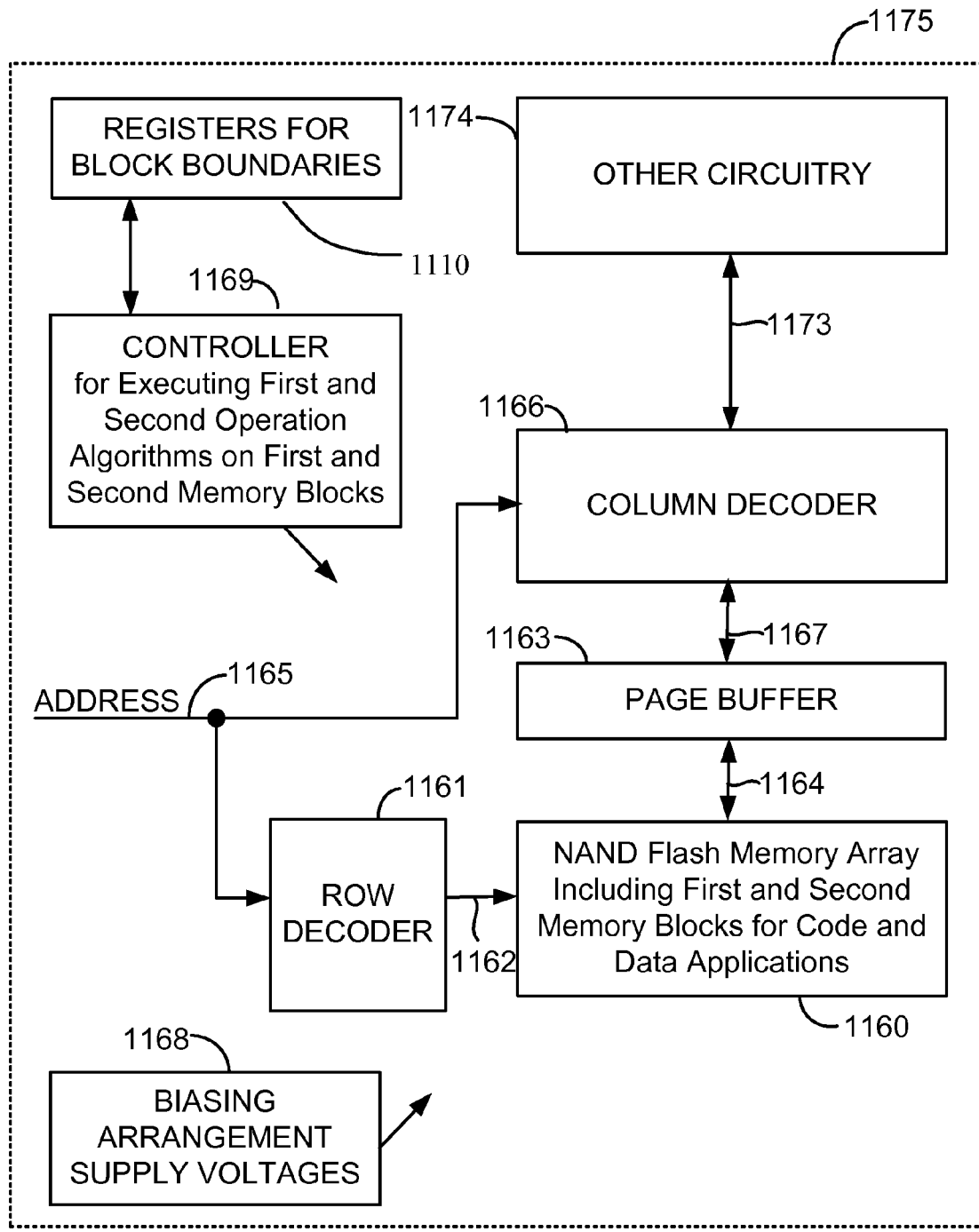
FIG. 11 is a simplified block diagram of an integrated circuit device employing configurable code and data memory blocks and bias circuitry according to embodiments of the present invention.

FIG. 11 is a simplified block diagram of an integrated circuit device 1175 including a NAND flash memory array 1160 that includes first and second memory blocks and bias circuitry 1168. The first and second memory blocks are configurable to store data for a first pattern of data usage and a second pattern of data usage in response to a first operation algorithm and a second operation algorithm, respectively. The first pattern of data usage can be for code flash memory applications, and the second pattern of data usage can be for data flash memory applications. In some embodiments, the memory array 1160 can include single levels of cells (SLC). In other embodiments, the memory array 1160 can include multiple levels of cells (MLC). A row decoder 1161 is coupled to a plurality of word lines 1162 arranged along rows in the memory array 1160. Column decoders in block 1166 are coupled to a set of page buffers 1163, in this example via data bus 1167. The global bit lines 1164 are coupled to local bit lines (not shown) arranged along columns in the memory array 1160. Addresses are supplied on bus 1165 to column decoder (block 1166) and row decoder (block 1161). Data is supplied via the data-in line 1173 from other circuitry 1174 (including for example input/output ports) on the integrated circuit, such as a general purpose processor or special purpose application circuitry, or a combination of modules providing system-on-a-chip functionality supported by the memory array 1160. Data is supplied via the line 1173 to input/output ports or to other data destinations internal or external to the integrated circuit device 1175.

A controller 1169, implemented for example as a state machine, provides signals to control the application of bias arrangement supply voltages generated or provided through the voltage supply or supplies in block 1168 to carry out the various operations described herein. These operations include erase and read operations, and modified ISPP programming as described above. The controller can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The controller 1169 can be configured to implement a method for operating the integrated circuit device 100 including the first memory block and the second memory block. The method can include:

executing a first operation algorithm to read, program and erase data in a first memory block;

executing a second operation algorithm to read, program and erase data in a second memory block;

applying a word line pass voltage for read operations at a first voltage level in the first operation algorithm; and applying a second word line pass voltage for read operations at a second voltage level in the second operation algorithm, wherein the first voltage level is lower than the second voltage level.

The first operation algorithm can include a first read operation to read a first selected cell in a NAND string in the first memory block, and the second read operation algorithm can include a second read operation to read a second selected cell in a NAND string in the second memory block. The method can further apply first word line pass voltages for read operations (V-PASSR1) to unselected cells in the NAND string having V-PASSR1 peak voltage levels in the first read operation, and apply second word line pass voltages for read operations (V-PASSR2) to unselected cells in the NAND string having V-PASSR2 peak voltage levels in the second read operation. The V-PASSR1 and V-PASSR2 voltages are relative to a common voltage potential, and an average value of the V-PASSR1 peak voltage levels is lower than an average value of the V-PASSR2 peak voltage levels.

The first operation algorithm can include a first program operation to program a first selected cell in a NAND string in the first memory block. The second operation algorithm can include a second program operation to program a second selected cell in a NAND string in the second memory block. The method can further apply a first program bias (V-PGM1) to the first selected cell having V-PGM1 peak voltage levels in the first program operation, and apply a second program bias (V-PGM2) to the second selected cell having V-PGM2 peak voltage levels in the second program operation. Voltage levels including the V-PGM1 and V-PGM2 peak voltage levels in the first program bias and the second program bias are relative to a common voltage potential, and an average value of V-PGM1 peak voltage levels is lower than an average value of V-PGM2 peak voltage levels.

The controller 1169 is coupled to the NAND flash memory array 1160. The first and second memory blocks are distinguishable by block boundaries including a high block boundary and a low block boundary. The first memory block includes memory cells at addresses within a range between the high block boundary and the low block boundary. At least one of the high block boundary and the low block boundary can be stored in the memory array. Alternatively, at least one of the high block boundary and the low block boundary can be stored in registers 1110 for block boundaries. The controller 1169 can retrieve the at least one of the high block boundary and the low block boundary from the NAND flash memory array 1160 or from the registers 1110 for block boundaries. The controller 1169 can adjust the at least one of the high block boundary and the low block boundary in the NAND flash memory array 1160 or in the registers 1110 for block boundaries, in response to receiving commands from a process external to the integrated circuit device 1175.

Figure 12:
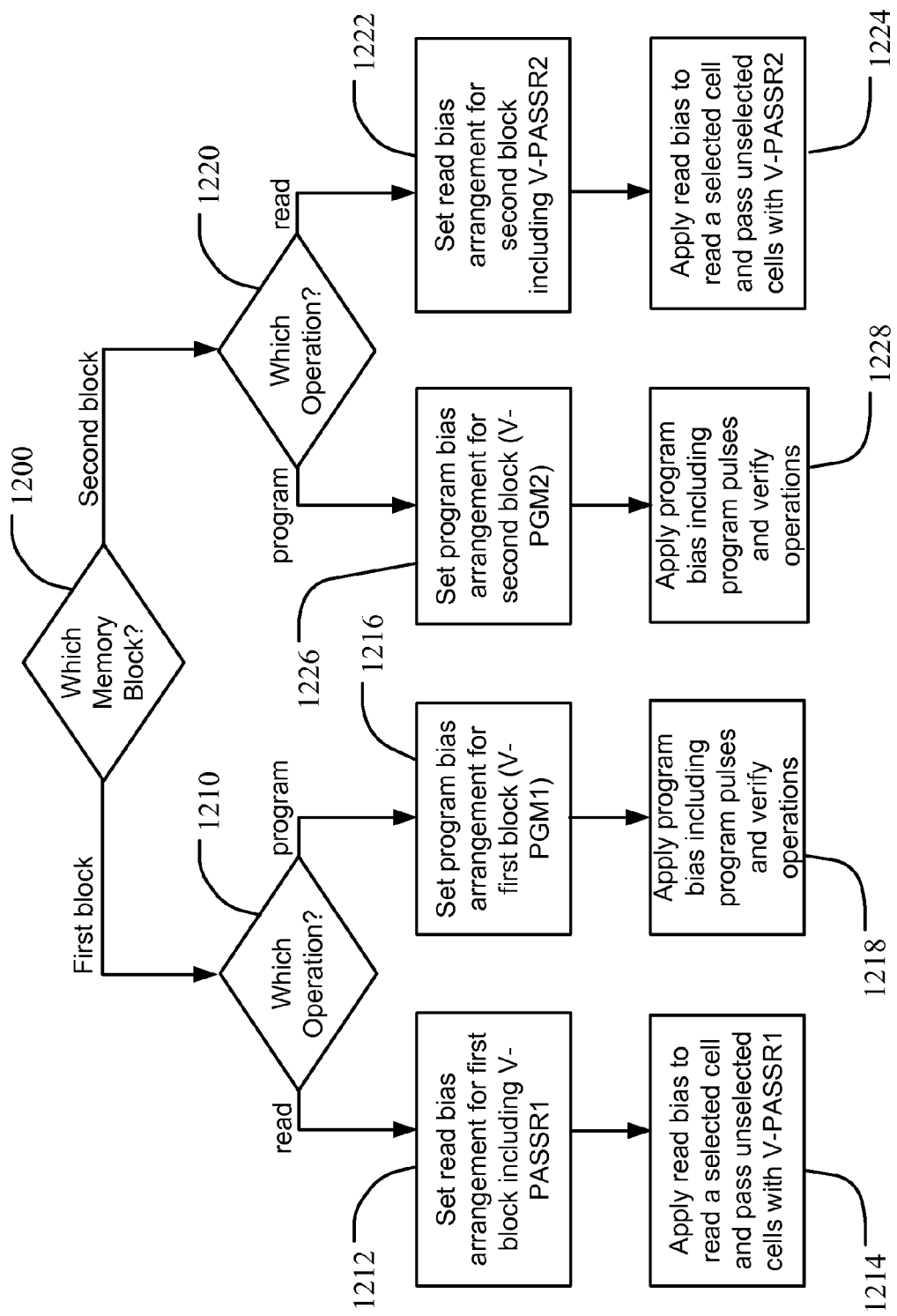
FIG. 12 is a simplified flowchart of an embodiment of a method executed by a controller in an integrated circuit like that of FIG. 11 for first and second operation algorithms on first and second memory blocks.

FIG. 12 is a simplified flowchart of an embodiment of method executed by a controller in an integrated circuit like that of FIG. 11 for first and second operation algorithms on first and second memory blocks. Based on whether an operation is on a NAND string in the first memory block or the second memory block, the controller selects the first operation algorithm or the second operation algorithm (1200).

For the first operation algorithm, if the operation is to read a first selected cell in the NAND string (1210), the controller, including the supporting circuitry on the chip, sets a read bias arrangement for the first memory block (1212). The read bias arrangement includes first word line pass voltages for read operations (V-PASSR1). The controller applies the read bias, including applying the V-PASSR1 to unselected cells in the NAND string, and other voltages to read the first selected cell (1214). If the operation is to program a first selected cell in the NAND string (1210), the controller sets a program bias (V-PGM1) for the first memory block (1216). The program bias includes a first iterative sequence of program pulses and verify operations. The controller applies the program bias, including applying the first iterative sequence on the first selected cell (1218).

For the second operation algorithm, if the operation is to read a second selected cell in the NAND string (1220), the controller, including the supporting circuitry on the chip, sets a read bias arrangement for the second memory block (1222). The read bias arrangement includes second word line pass voltages for read operations (V-PASSR2). The controller applies the read bias, including applying the V-PASSR2 to unselected cells in the NAND string, and other voltages to read the second selected cell (1224). If the operation is to program a second selected cell in the NAND string (1220), the controller sets a program bias (V-PGM2) for the second memory block (1226). The program bias includes a second iterative sequence of program pulses and verify operations. The controller applies the program bias, including applying the second iterative sequence on the second selected cell (1228).

A V-PASSR1 peak voltage level applied to an unselected cell a number of cells away from the first selected cell in a NAND string in the first memory block is lower than a V-PASSR2 peak voltage level applied to an unselected cell the same number of cells away from the second selected cell in a NAND string in the second memory block. A first program pulse in the first iterative sequence of program pulses in V-PGM1 is at a lower voltage level than a first program pulse in the second iterative sequence of program pulses in V-PGM2.

In operation, depending on system requirements which may change during the use of the memory, after an operation algorithm, such as the first operation algorithm, is applied to a physical or logical block for a pattern of data usage, the controller can apply a different operation algorithm, such as the second operation algorithm, to the same physical or logical block for another pattern of data usage. In support of this change, the controller can include logic to change assignment of the first operation algorithm to the first block to the second memory block, such as a register or a table in memory, that specifies a mode of operation for one or more of the blocks memory cells. The register or table can be updated as the needs of the system change.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
a first memory block comprising memory cells, configurable to store data for a first pattern of data usage in response to a first operation algorithm;
a second memory block comprising memory cells, configurable to store data for a second pattern of data usage in response to a second operation algorithm; and
controller circuitry coupled to the first and second memory blocks, and configured to execute the first operation algorithm in response to a first selected cell being in the first memory block and to execute the second operation algorithm in response to a second selected cell being in the second memory block, wherein a word line pass voltage applied in the first operation algorithm is at a lower voltage level than a second word line pass voltage applied in the second operation algorithm.

2. The device of claim 1, wherein the first operation algorithm includes an operation to read the first selected cell in a NAND string in the first memory block, in which first word line pass voltages for read operations (V-PASSR1) are applied to unselected cells in the NAND string having V-PASSR1 peak voltage levels, and the second operation algorithm includes an operation to read the second selected cell in a NAND string in the second memory block, in which second word line pass voltages for read operations (V-PASSR2) are applied to unselected cells in the NAND string having V-PASSR2 peak voltage levels, wherein the V-PASSR1 and V-PASSR2 voltages are relative to a common voltage potential, and an average value of the V-PASSR1 peak voltage levels is lower than an average value of the V-PASSR2 peak voltage levels.

3. The device of claim 1, wherein the first operation algorithm includes an operation to read the first selected cell in the NAND string in the first memory block, in which first word line pass voltages for read operations (V-PASSR1) are applied to unselected cells in the NAND string having V-PASSR1 peak voltage levels, and the second operation algorithm includes an operation to read the second selected cell in a NAND string in the second memory block, in which second word line pass voltages for read operations (V-PASSR2) are applied to unselected cells in the NAND string having V-PASSR2 peak voltage levels, wherein a V-PASSR1 peak voltage level applied to an unselected cell a number of cells away from the first selected cell in the NAND string in the first memory block is lower than a V-PASSR2 peak voltage level applied to an unselected cell the same number of cells away from the second selected cell in the NAND string in the second memory block.

4. The device of claim 1, wherein the first operation algorithm includes an operation to program the first selected cell in a NAND string in the first memory block, in which a first program bias (V-PGM1) is applied to the first selected cell having V-PGM1 peak voltage levels, and the second operation algorithm includes an operation to program the second selected cell in a NAND string in the second memory block, in which a second program bias (V-PGM2) is applied to the second selected cell having V-PGM2 peak voltage levels, wherein voltage levels including the V-PGM1 and V-PGM2 peak voltage levels in the first program bias and the second program bias are relative to a common voltage potential, and an average value of V-PGM1 peak voltage levels is lower than an average value of V-PGM2 peak voltage levels.

5. The device of claim 1, wherein the first operation algorithm includes an operation to program the first selected cell in a NAND string in the first memory block, in which a first program bias (V-PGM1) is applied to the first selected cell having V-PGM1 peak voltage levels, and the second operation algorithm includes an operation to program the second selected cell in a NAND string in the second memory block, in which a second program bias (V-PGM2) is applied to the second selected cell having V-PGM2 peak voltage levels, wherein the first program bias (V-PGM1) includes a first iterative sequence of program pulses and verify operations, and the second program bias (V-PGM2) includes a second iterative sequence of program pulses and verify operations, wherein a first program pulse in the first iterative sequence of program pulses is at a lower voltage level than a first program pulse in the second iterative sequence of program pulses, the first iterative sequence includes at least one subsequence of program pulses with incrementally increased voltage levels, and the second iterative sequence includes at least one subsequence of program pulses with incrementally increased voltage levels.

6. The device of claim 1, wherein the word line pass voltage and the second word line pass voltage include word line pass voltages for read operations.

7. A method of operating an integrated circuit device including a first memory block comprising memory cells and a second memory block comprising memory cells, comprising:
   executing a first operation algorithm in response to a first selected cell being in the first memory block;
   executing a second operation algorithm in response to a second selected cell being in the second memory block;
   applying a word line pass voltage at a first voltage level in the first operation algorithm; and
   applying a second word line pass voltage at a second voltage level in the second operation algorithm, wherein the first voltage level is lower than the second voltage level; wherein
   the first memory block comprises memory cells, configurable to store data for a first pattern of data usage in response to the first operation algorithm; and
   the second memory block comprises memory cells, configurable to store data for a second pattern of data usage in response to the second operation algorithm.

8. The method of claim 7, wherein the first operation algorithm includes a first operation to read the first selected cell in a NAND string in the first memory block, and the second operation algorithm includes a second operation to read the second selected cell in a NAND string in the second memory block, further comprising:
   applying first word line pass voltages for read operations (V-PASSR1) to unselected cells in the NAND string having V-PASSR1 peak voltage levels in the first operation; and
   applying second word line pass voltages for read operations (V-PASSR2) to unselected cells in the NAND string having V-PASSR2 peak voltage levels in the second operation;
   wherein the V-PASSR1 and V-PASSR2 voltages are relative to a common voltage potential, and an average value of the V-PASSR1 peak voltage levels is lower than an average value of the V-PASSR2 peak voltage levels.

9. The method of claim 7, wherein the first operation algorithm includes a first operation to read the first selected cell in a NAND string in the first memory block, and the second operation algorithm includes a second operation to read the second selected cell in a NAND string in the second memory block, further comprising:
   applying first word line pass voltages for read operations (V-PASSR1) to unselected cells in the NAND string having V-PASSR1 peak voltage levels in the first operation; and
   applying second word line pass voltages for read operations (V-PASSR2) to unselected cells in the NAND string having V-PASSR2 peak voltage levels in the second operation;
   wherein a V-PASSR1 peak voltage level applied to an unselected cell a number of cells away from the first selected cell in the NAND string in the first memory block is lower than a V-PASSR2 peak voltage level applied to an unselected cell the same number of cells away from the second selected cell in the NAND string in the second memory block.

10. The method of claim 7, wherein the first operation algorithm includes a first operation to program the first selected cell in a NAND string in the first memory block, and the second operation algorithm includes the second operation to program a second selected cell in a NAND string in the second memory block, further comprising:
    applying a first program bias (V-PGM1) to the first selected cell having V-PGM1 peak voltage levels in the first operation; and
    applying a second program bias (V-PGM2) to the second selected cell having V-PGM2 peak voltage levels in the second operation;
    wherein voltage levels including the V-PGM1 and V-PGM2 peak voltage levels in the first program bias and the second program bias are relative to a common voltage potential, and an average value of V-PGM1 peak voltage levels is lower than an average value of V-PGM2 peak voltage levels.

11. The method of claim 7, wherein the first operation algorithm includes a first operation to program the first selected cell in a NAND string in the first memory block, and the second operation algorithm includes a second operation to program the second selected cell in a NAND string in the second memory block, further comprising:

applying a first program bias (V-PGM1) to the first selected cell having V-PGM1 peak voltage levels in the first operation; and applying a second program bias (V-PGM2) to the second selected cell having V-PGM2 peak voltage levels in the second operation;

wherein the first program bias (V-PGM1) includes a first iterative sequence of program pulses and verify operations, and the second program bias (V-PGM2) includes a second iterative sequence of program pulse and verify operations, wherein a first program pulse in the first iterative sequence of program pulses is at a lower voltage level than a first program pulse in the second iterative sequence of program pulses, the first sequence includes at least one subsequence of program pulses with incrementally increased voltage levels, and the second sequence includes at least one subsequence of program pulses with incrementally increased voltage levels.

12. The method of claim 7, wherein the word line pass voltage and the second word line pass voltage include word line pass voltages for read operations.

13. An integrated circuit device, comprising:

a memory array comprising memory cells, configurable to store data for a first pattern of data usage in response to a first operation algorithm, and to store data for a second pattern of data usage in response to a second operation algorithm, wherein the first pattern of data usage includes a first rate of data cycling, and the second pattern of data usage includes a second rate of data cycling, the second rate being higher than the first rate;

controller circuitry coupled to the memory array, and configured to execute the first operation algorithm in response to a first selected cell being in a first block of memory cells in the memory array and to execute the second operation algorithm in response to a second selected cell being in a second block of memory cells in the memory array, wherein a word line pass voltage applied in the first operation algorithm is at a lower voltage level than a second word line pass voltage applied in the second operation algorithm, the first and second blocks are distinguishable by block boundaries including a high block boundary and a low block boundary, the first memory block including memory cells at addresses within a range between the high block boundary and the low block boundary.

14. The device of claim 13, wherein at least one of the high block boundary and the low block boundary is stored in the memory array.

15. The device of claim 13, further including registers, wherein boundary information for at least one of the high block boundary and the low block boundary is stored in the registers.

16. The device of claim 13, wherein at least one of the high block boundary and the low block boundary is adjustable via commands received from a process external to the device.

17. The device of claim 13, the controller circuitry including logic to apply the first operation algorithm to the second block after the first operation algorithm is applied to the first block.

18. The device of claim 13, wherein the word line pass voltage and the second word line pass voltage include word line pass voltages for read operations.

* * * * *